US006982434B2

United States Patent
Smith

(10) Patent No.: US 6,982,434 B2
(45) Date of Patent: Jan. 3, 2006

(54) QUANTUM-WELL MEMORY DEVICE AND METHOD FOR MAKING THE SAME

(75) Inventor: Yen-Hao Smith, Hsinchu (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/831,431

(22) Filed: Apr. 23, 2004

(65) Prior Publication Data
US 2005/0236613 A1 Oct. 27, 2005

(51) Int. Cl.
*H01L 29/06* (2006.01)
(52) U.S. Cl. .............................. 257/24; 257/14; 257/20
(58) Field of Classification Search .................. 257/14, 257/20, 24, 27
See application file for complete search history.

(56) References Cited

U.S. PATENT DOCUMENTS 6,169,308 B1 * 1/2001 Sunami et al. .............. 257/321
6,555,839 B2 * 4/2003 Fitzgerald ..................... 257/18
6,620,664 B2 * 9/2003 Ma et al. ..................... 438/183

* cited by examiner

*Primary Examiner*—Allan R. Wilson
(74) *Attorney, Agent, or Firm*—Martine Penilla & Gencarella, LLP

(57) ABSTRACT

A quantum-well memory device and method is provided. The quantum-well memory device includes a substrate with two junctions. A sandwiched gate insulator is formed on top of the substrate and extended in length between the two junctions. The sandwiched gate insulator has a top layer, a middle layer, and a bottom layer. The middle layer is more soluble to an acid etch than the top and the bottom layer of the gate insulator. Polysilicon inserts are defined at the undercuts formed by selectively and self-limitedly etching the sidewalls of the middle layer of the gate insulator. The polysilicon inserts are positioned beside the middle layer and between the top layer and the bottom layer of the gate insulator. A method for fabricating such a device is also described.

9 Claims, 6 Drawing Sheets

QUANTUM-WELL MEMORY DEVICE AND METHOD FOR MAKING THE SAME

BACKGROUND OF THE INVENTION

1. Field of the Invention

The present invention relates generally to a semiconductor memory device, and more particularly, to a quantum-well memory device (QWMD) and a method for making such a device.

2. Description of the Related Art

Presently, nanoelectronic technology has been utilized to fabricate quantum-well memory devices (QWMD). Such a device, using quantum-well structure in its floating gate, can be scaled well below a 50 nm gate length. Self-limited processes determine the dimensions of quantum-wells in a QWMD. Besides excellent charge retention, a QWMD also has the advantages of fast programming and erasing.

FIG. 1A shows the fabrication process of one known quantum-well memory device 100. As shown in FIG. 1A(1), a gate oxide (GOX) 120 is grown on top of a p-type substrate 110, and a polysilicon gate 130 is deposited on top of the GOX 120. FIG. 1A(2) shows that the GOX 120 is then etched with diluted hydrofluoric (HF) acid during a self-limited wet etching process, resulting in undercuts 120'. Next, a layer of bottom oxide (BOX) 140 (formed on the substrate 110 surface) and a conformal layer of top oxide (TOX) 150 (formed over the polysilicon gate 130) are defined during an oxidation process. FIG. 1A(3) indicates that a conformal layer of polysilicon 160 substantially fills the undercuts 120' and covers the BOX 140 and the TOX 150. As shown in FIG. 1A(4), an oxidized layer 170 is formed by oxidizing the polysilicon 160 until the outer encapsulating portion of the polysilicon 160 is converted into an oxidized layer except for the portion of polysilicon 160 embedded at the undercuts 120'. As a result, the un-oxidized portion of polysilicon 160 creates polysilicon inserts 180. Finally, two junctions 190a and 190b are implanted next to the poly inserts 180.

One drawback of the device 100 is the simultaneous growth of the TOX 150 and the BOX 140 during the oxidation process. Another drawback of the device 100 is the structure deformation after the oxidation process, which is shown in FIG. 1B. In addition, the diluted HF acid used in the wet etching process results in the undesired non self-limited etching on the shallow trench isolation (STI) structure along the channel width, as is shown in FIG. 1C.

In view of the foregoing, there is a need for a new quantum-well fabrication method and device that can not only provide fast programming and erasing performance and good data retention characteristics, but also overcome the above-mentioned drawbacks of the known QWMD 100.

SUMMARY OF THE INVENTION

Broadly speaking, the present invention fills these needs by providing a quantum-well memory device (QWMD) that includes a sandwiched gate insulator instead of the gate oxide (GOX) used in the prior art QWMD. A method for fabricating the device is also described.

In accordance with one aspect of the present invention, a QWMD is provided. This QWMD includes a substrate with two junctions. A sandwiched gate insulator is formed on top of the substrate and is extended in length between the two junctions. The sandwiched gate insulator has a bottom layer, a top layer, and a middle layer. The top layer and the bottom layers are oxide layers, while the middle layer is more soluble to an acid etch than the top and the bottom oxide layers. Two polysilicon inserts are defined at the undercuts formed at the sidewalls of the gate insulator by selectively and self-limitedly etching the sidewalls of the middle layer of the gate insulator. The polysilicon inserts are positioned beside the middle layer and between the top layer and the bottom layer of the gate insulator.

In accordance with another aspect of the present invention, a method for fabricating a QWMD is described. In this method, a substrate having a sandwiched gate insulator formed thereon is provided. The gate insulator has a top layer, a middle layer, and a bottom layer. All three layers of the gate insulator are approximately the same length. Preferably, the bottom layer and the top layer are oxide layers, and the middle layer is more soluble to an acid etch than the top and the bottom layers. A polysilicon gate is formed on the top layer of the gate insulator. Sidewalls of the middle layer of the gate insulator is selectively and self-limitedly etched with a chemical, preferably phosphoric acid, such that undercuts are formed beside the middle layer and between the top layer and the bottom layer of the gate insulator. A layer of polysilicon is substantially deposited over the polysilicon gate and extending to the substrate such that the undercuts at the sidewalls of the gate insulator are completely filled. This layer of the polysilicon is then oxidized for a period of time until the outer encapsulating portion of the polysilicon is converted into an oxidized layer except for the inner portion of the polysilicon embedded at the undercuts. The non-oxidized portion of polysilicon embedded at the undercuts forms the poly inserts, i.e., the quantum-well structure.

As an advantage, the QWMD of the present invention avoids the top oxide layer and the bottom oxide simultaneous growth problem that exits in known QWMD, and minimizes the structure deformation by skipping the oxidization process for the top layer and the bottom layer of the gate insulator. Because phosphoric acid rather than hydrofluoric acid is used to etch the middle layer of the gate insulator, the shallow trench isolation (STI) structure can be protected from non self-limited etching. In addition, the middle layer of the gate insulator will determine the thickness of poly inserts of the QWMD of the present invention, which provides for a simplified fabrication process.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 2:
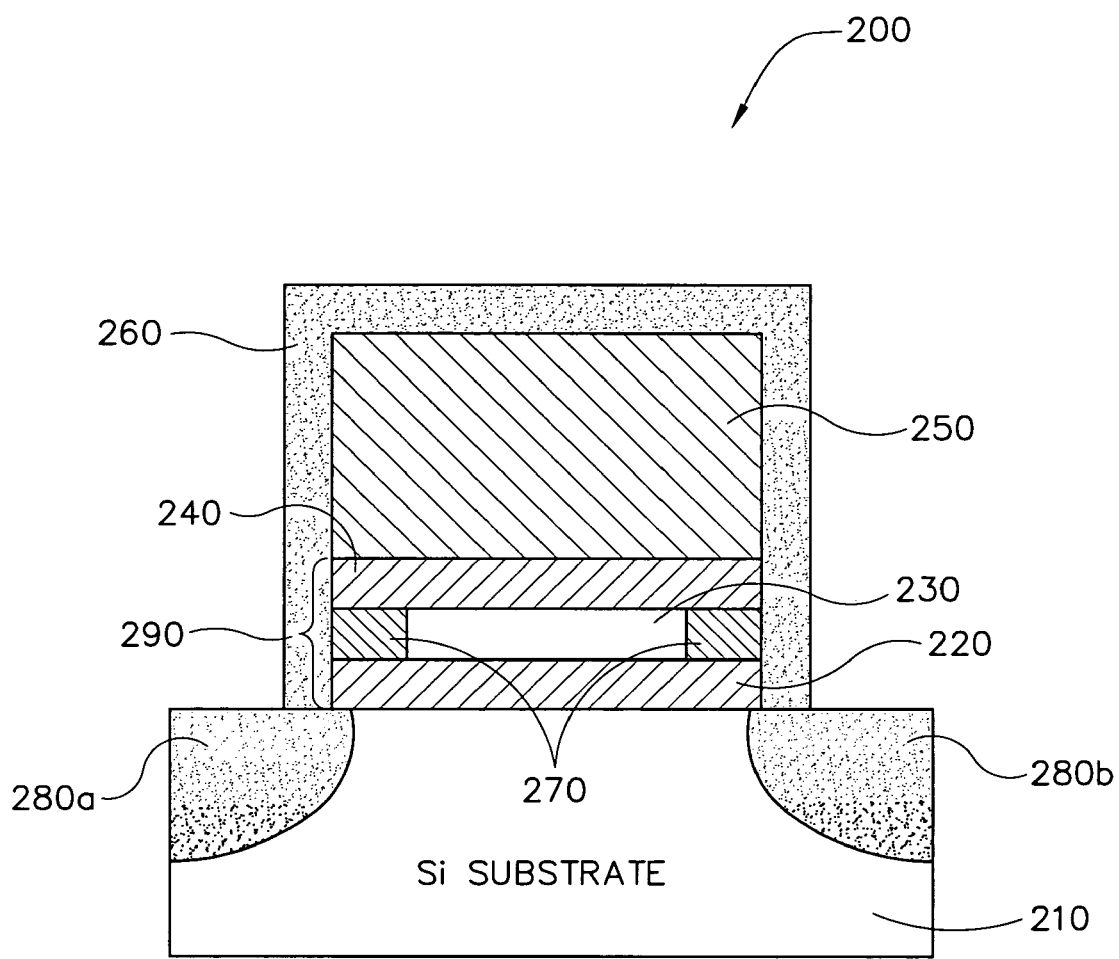
FIG. 2 shows a cross-sectional view of a QWMD in accordance with one embodiment of the present invention.

FIG. 2 is a cross-sectional view of a quantum-well memory device (QWMD) in accordance with one embodiment of the present invention. As shown in FIG. 2, silicon substrate 210 has two doped junctions 280a and 280b. A sandwiched gate insulator 290 formed on top of the silicon substrate 210 includes a bottom layer 220, a middle layer 230, and a top layer 240. Preferably, the bottom layer 220 and the top layer 240 of the gate insulator 290 are oxide layers, while the middle layer 230 of the gate insulator 290 is a nitride or an $Al_2O_3$ layer. Polysilicon inserts 270 are located beside the middle layer 230 in the same level and between the top layer 240 and the bottom layer 220 of the gate insulator 290. A polysilicon gate 250 is defined over the top layer 240 of the gate insulator 290. A conformal oxidized layer 260 encapsulates the polysilicon gate 250, sidewalls of the gate insulator 290, and the poly inserts 270.

Figure 3A:
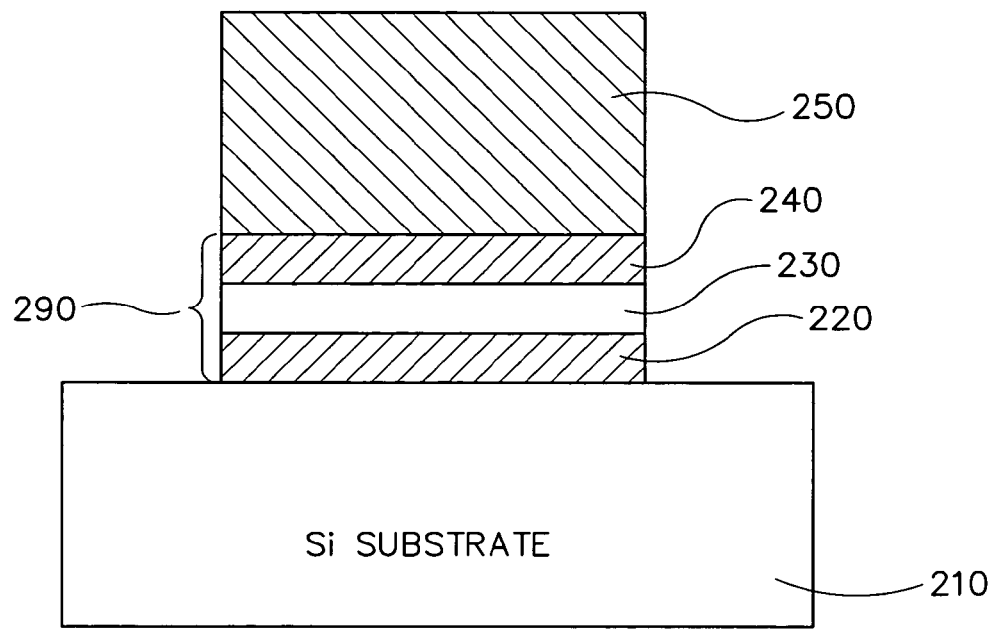
FIGS. 3A–3D illustrate an exemplary method for fabricating the QWMD shown in FIG. 2, in accordance with one embodiment of the present invention.

FIGS. 3A–3D illustrate an exemplary method for fabricating the QWMD 200 shown in FIG. 2. With reference to FIG. 3A, a silicon substrate 210 has a sandwiched gate insulator 290 formed thereon. Including a bottom layer 220, a middle layer 230, and a top layer 240, the gate insulator 290 preferably has Oxide-nitride-Oxide or Oxide-$Al_2O_3$-Oxide sandwiched layers. A polysilicon gate 250 is formed on top of the top layer 240 of the gate insulator 290. Standard deposition, photolithography, etching, and cleaning processes can be used to complete the fabrication operations.

Figure 3B:
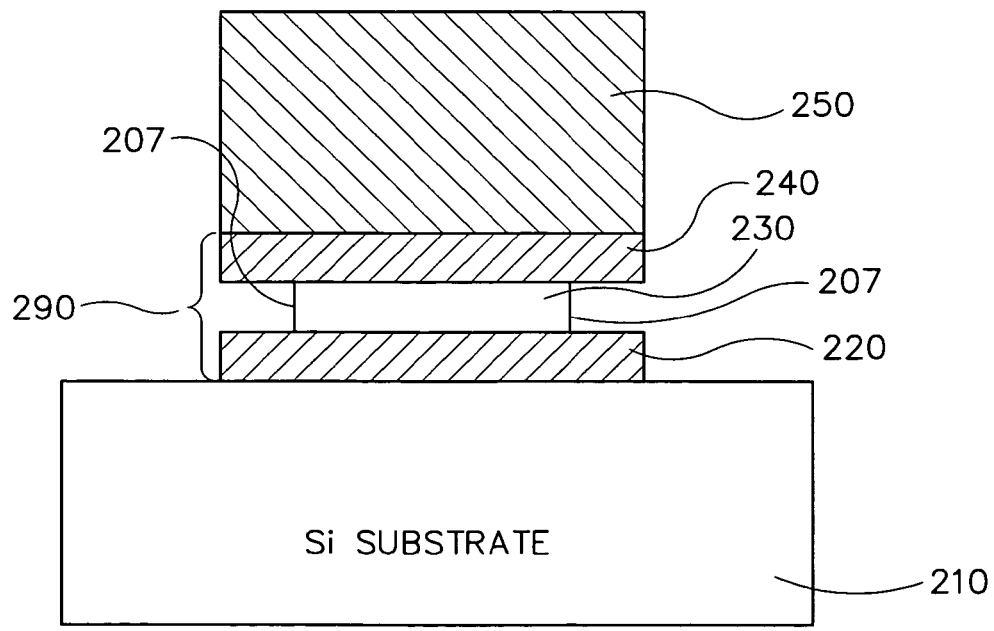

Next, as shown in FIG. 3B, undercuts 207 are created at sidewalls of the middle layer 230 of the gate insulator 290. By way of example, phosphoric acid can be used to selectively and self-limitedly etch the middle layer 230 to create the undercuts 207 for poly deposition. In one embodiment, the etch can be a timed etch. In one embodiment, the time can range between 60 seconds and about 1200 seconds, and in a specific example, the time can be set at about 300 seconds.

Figure 3C:
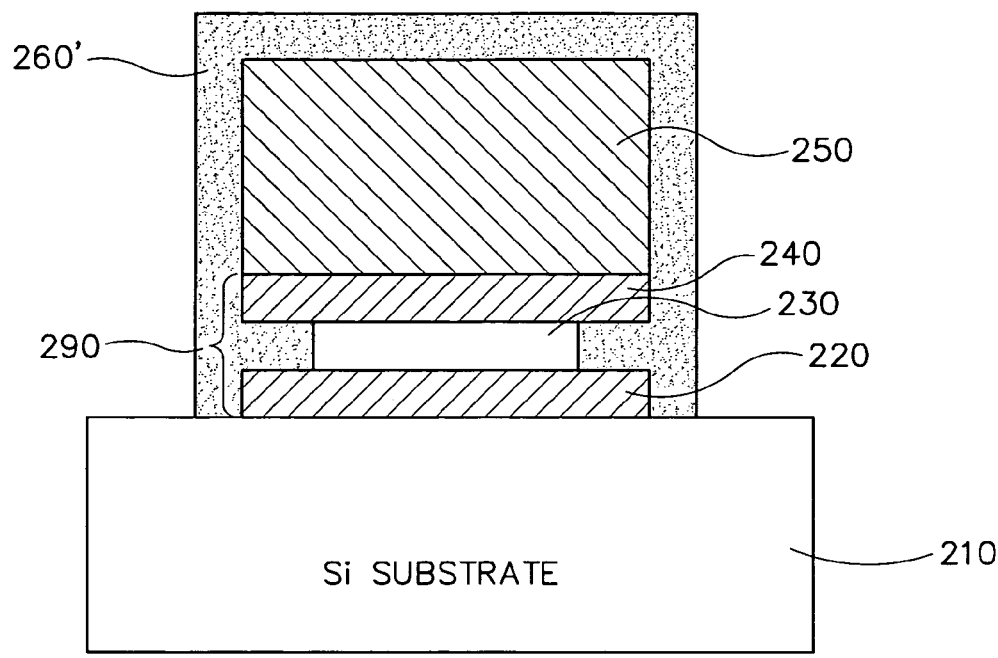
Figure 3D:
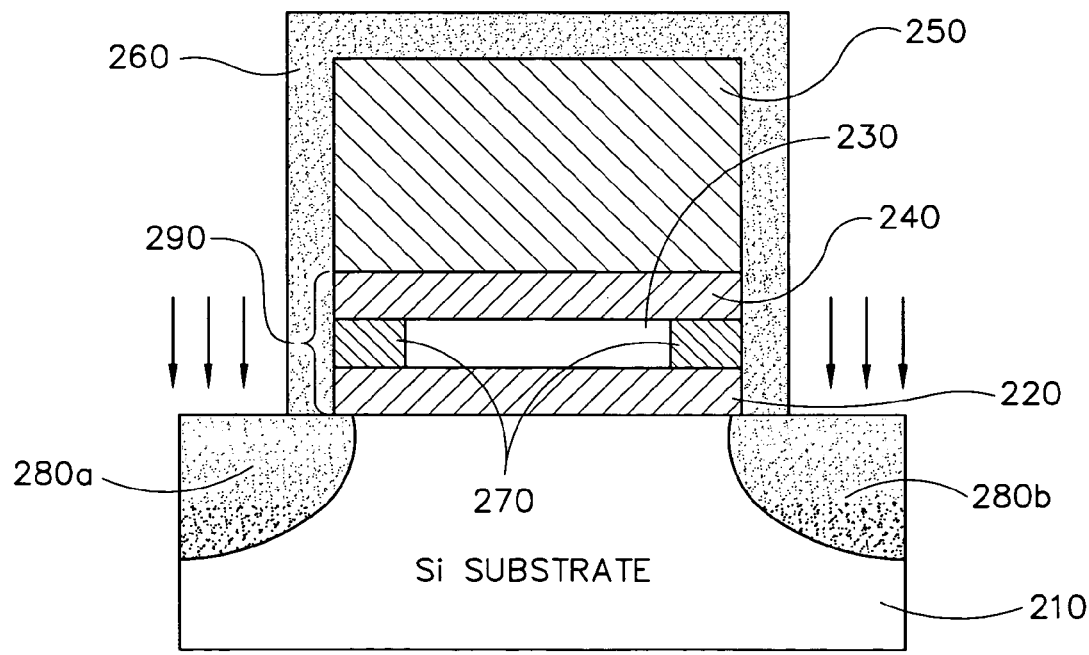

Turning to FIG. 3C and FIG. 3D, a conformal layer of polysilicon 260' is deposited over the polysilicon gate 250. The resulting layer of polysilicon 260' extends to the substrate 210. The conformal layer of polysilicon 260' encapsulates the polysilicon gate 250 and the sidewalls of the etched gate insulator 290, and fills the undercuts 207. The conformal layer of polysilicon 260' is then oxidized for a period of time until an outer portion of the conformal layer of polysilicon, which encapsulates the polysilicon gate 250 and the etched gate insulator 290, is converted into an oxidized layer 260. The portion of the conformal layer of polysilicon 260' embedded at the undercuts 207 of the gate insulator 290 remains un-oxidized. The un-oxidized polysilicon embedded at the undercuts 207 of the gate insulator 290 becomes polysilicon inserts 270. Finally, two junctions 280a and 280b are implanted next to the gate insulator 290 on the substrate 210 as shown.

Figure 1A:
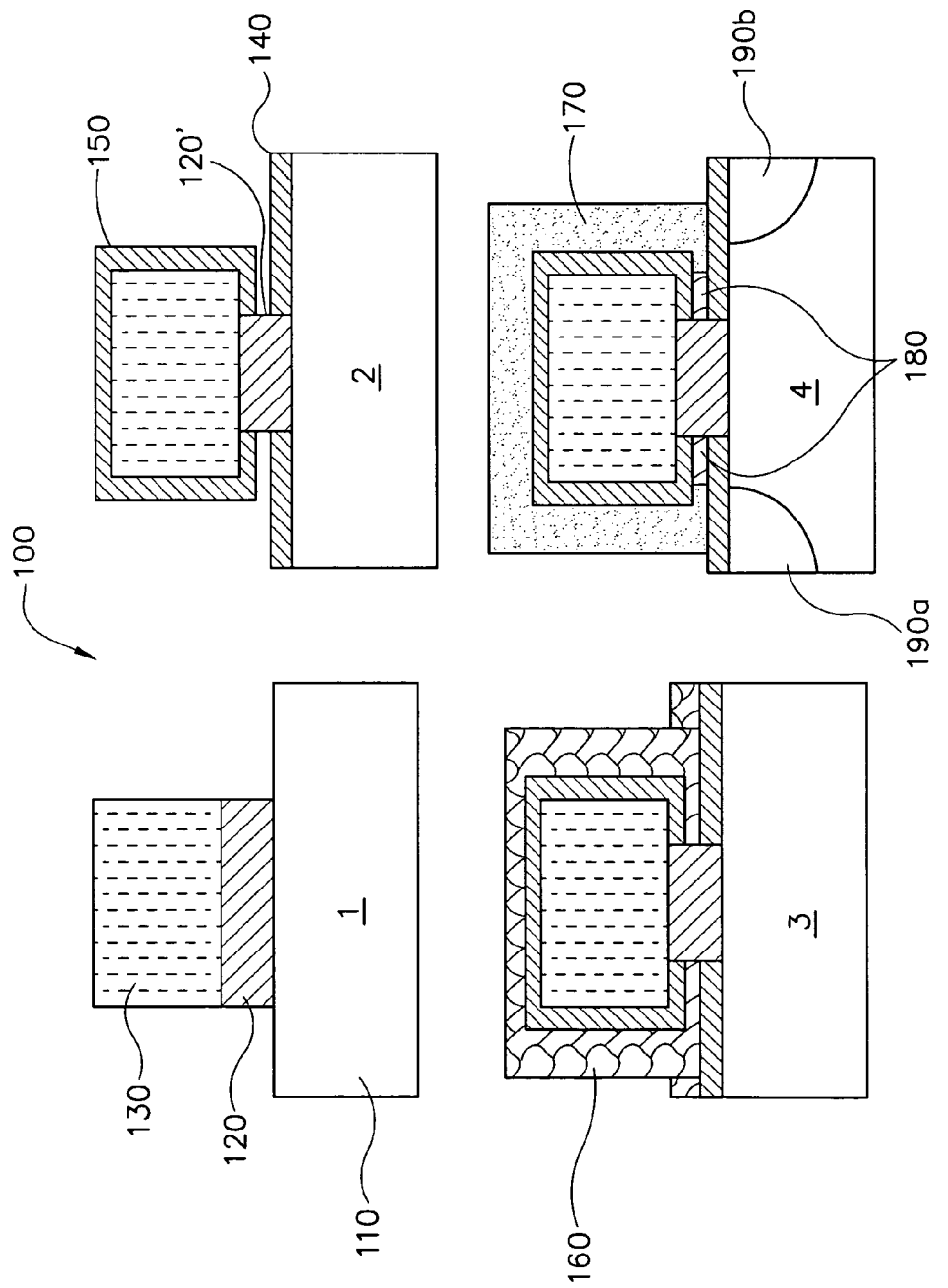
FIG. 1A illustrates a method for fabricating a known quantum-well memory device (QWMD).
Figure 1B:
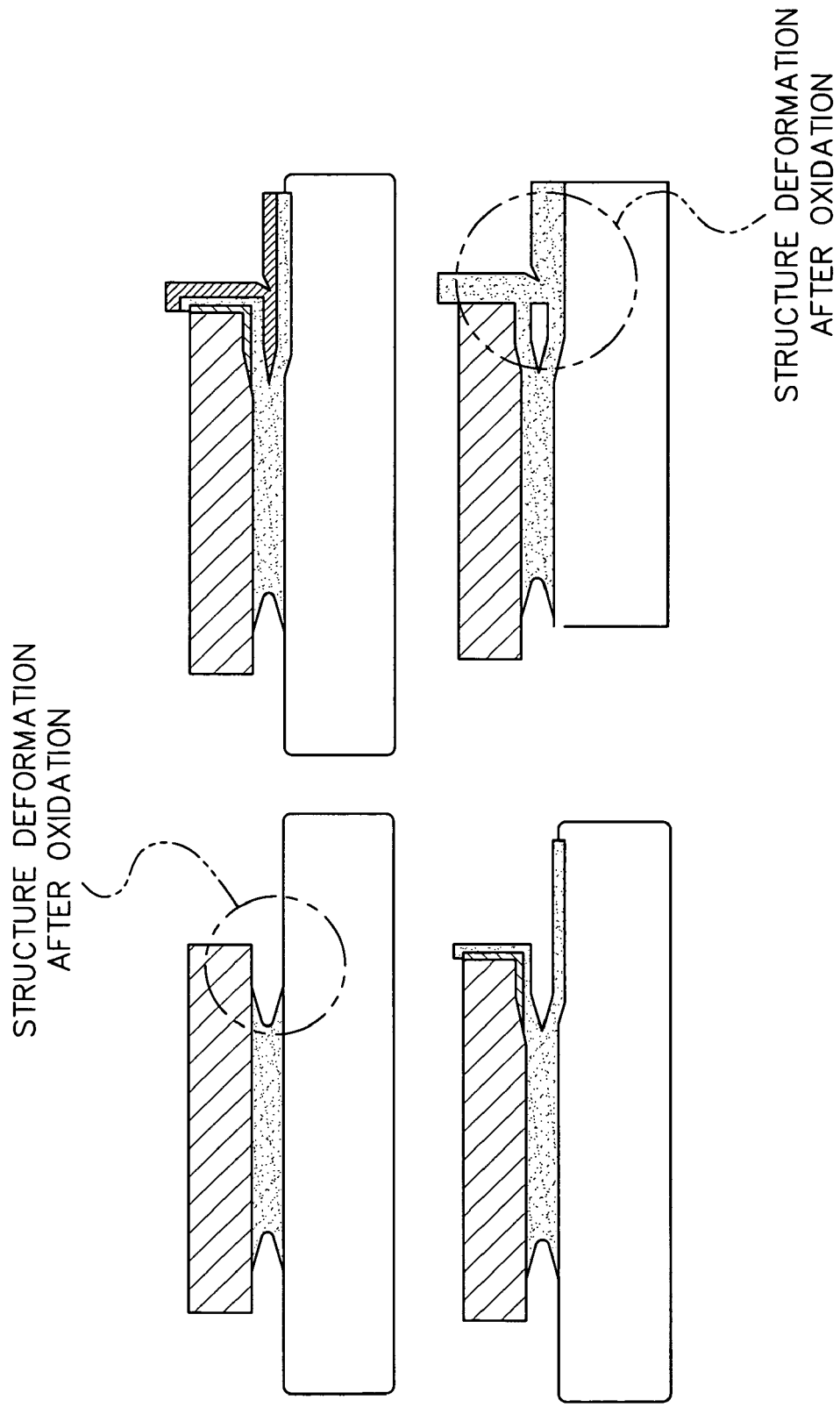
FIG. 1B shows the structure deformation after the oxidation process in the method demonstrated in FIG. 1A.
Figure 1C:
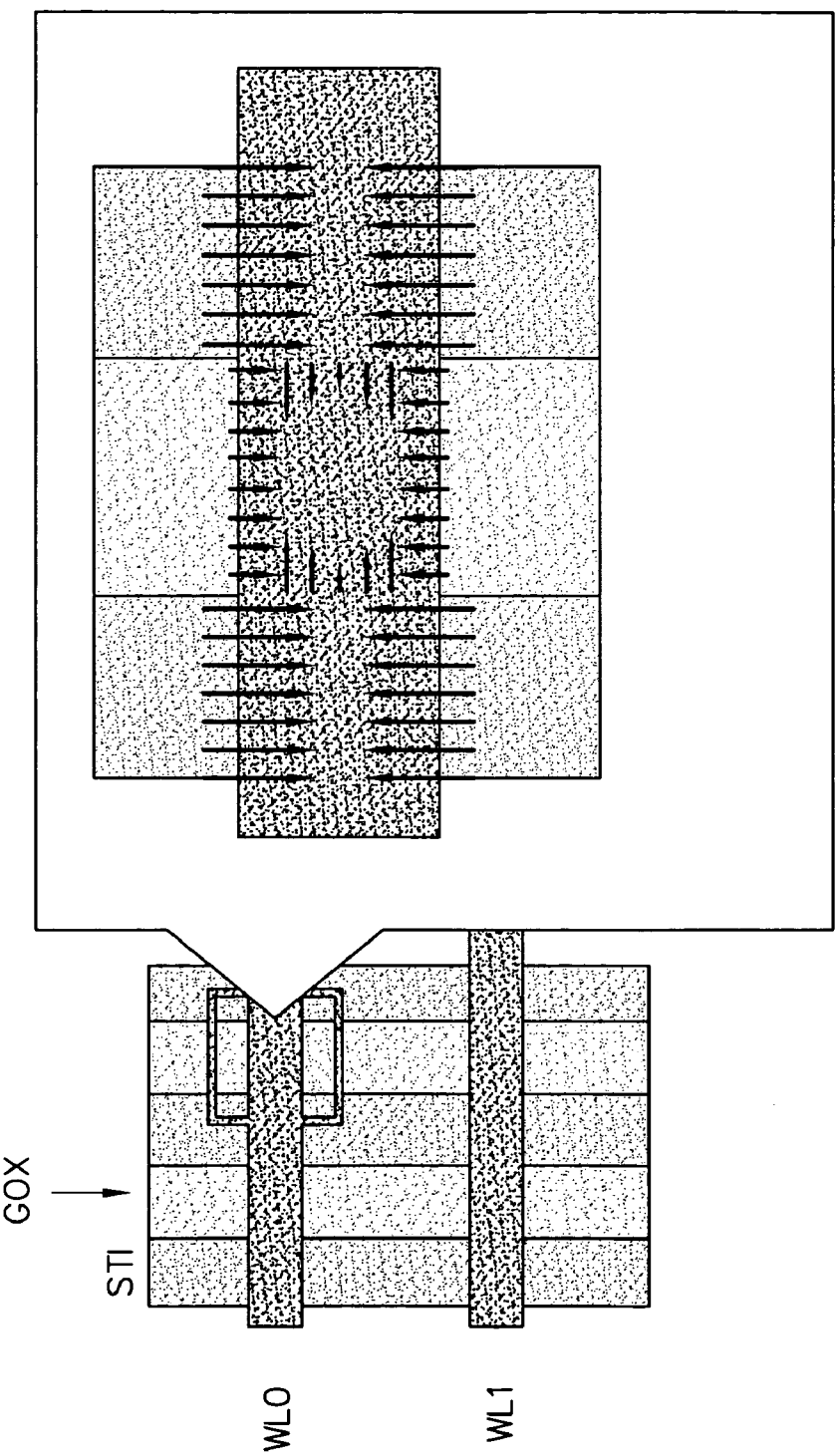
FIG. 1C shows the undesired non self-limited etching on the shallow trench isolation (STI) structure along the channel width caused by the etching chemical used in the method demonstrated in FIG. 1A.

Unlike the thickness of the polysilicon inserts 180 of FIG. 1A(4), which are determined by a complex combination of the GOX 120, the BOX 140, and the TOX 150, the thickness of the polysilicon inserts 270 are simply determined by the middle layer 230 of the gate insulator 290. The thickness of the middle layer 230 can be between about 100 Angstroms and about 20 Angstroms for the polysilicon inserts 270 to effectively form quantum wells. As a result, the effectively formed quantum wells, i.e., the polysilicon inserts 270, can provide fast programming and erasing performance by resonant tunneling effect. By storing charges into the respective the quantum wells, the memory density of the QWMD 200 could be doubled without increasing transistor density.

Because the top layer 240 and the bottom layer 220 of the gate insulator 290 can be formed individually in the QWMD 200; therefore, a thicker top layer 240 can be prepared to prevent charge leakage without affecting the thickness of the bottom layer 220. Furthermore, skipping the oxidation process for the top layer 240 and the bottom layer 220 minimizes the structure deformation. Since phosphoric acid rather than hydrofluoric-related chemicals are used to etch the undercuts 207 of the QWMD 200, the shallow trench isolation (STI) structure can be protected from non self-limited etching.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A quantum well memory device, comprising:
   a substrate;
   a bottom oxide layer having a first oxide property and extending a length between a first junction and a second junction;
   a middle insulator layer having a second property that is more soluble to an acid etch that the first property, the middle oxide layer extending less than the length between the first junction and second junction;
   a top oxide layer having the first oxide property and extending the length between the first junction and the second junction; and
   first and second polysilicon inserts defined in undercuts between the bottom oxide layer and the top oxide layer in a level of the middle insulator layer, the polysilicon inserts positioned beside the middle insulator layer and extending respectively to the first junction and the second junction.

2. A quantum well memory device 1, further comprising:
   a polysilicon gate defined over the top oxide layer.

3. A quantum well memory device 2, further comprising:
   an encapsulating oxidized layer defined over the polysilicon gate and extending to the substrate, the encapsulating layer covering sides walls of the top oxide layer, the first and second polysilicon inserts, and the bottom oxide layer.

4. A quantum-well memory device, comprising:
a substrate having a first junction and a second junction;
a gate insulator having a bottom layer with a first oxide property, a middle layer with a second property that is more soluble to an acid etch than said first property, and a top layer with said first oxide property, said top layer and said bottom layer of said gate insulator extending a length between said first junction and second junction, said middle layer of said gate insulator extending less than said length between said first junction and second junction, and said bottom layer of said gate insulator being defined on said substrate; and
first and second polysilicon inserts defined in undercuts defined at sidewalls of said middle layer and between said bottom layer and said top layer of said gate insulator, and said polysilicon inserts positioned beside said middle layer of said gate insulator and extending respectively to said first and second junctions.

5. The quantum-well memory device as recited in claim 4, further comprising a polysilicon gate defined over said top layer of said gate insulator.

6. The quantum-well memory device as recited in claim 4, further comprising an oxidized layer encapsulating said polysilicon gate and extending to said substrate, and said oxidized layer covering said first and second polysilicon inserts and sidewalls of said bottom layer and said top layer of said gate insulator.

7. The quantum-well memory device as recited in claim 4, wherein said second property of said middle layer of said gate insulator is nitride.

8. The quantum-well memory device as recited in claim 4, wherein said second property of said middle layer of said gate insulator is $Al_2O_3$.

9. The quantum-well memory device as recited in claim 4, wherein said middle layer of said gate insulator has a thickness of between about 100 Angstroms and about 20 Angstroms.

* * * * *